(12) United States Patent
Kim et al.

(10) Patent No.: US 11,528,018 B2
(45) Date of Patent: Dec. 13, 2022

(54) FLIP-FLOP, MASTER-SLAVE FLIP-FLOP, AND OPERATING METHOD THEREOF

(71) Applicant: Samsung Electronics Co., Ltd., Suwon-si (KR)

(72) Inventors: Jongwoo Kim, Osan-si (KR); Minsu Kim, Hwaseong-si (KR); Yonggeol Kim, Hwaseong-si (KR); Hyun Lee, Incheon (KR); Hyunchul Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/930,658

(22) Filed: Jul. 16, 2020

(65) Prior Publication Data

US 2021/0152161 A1    May 20, 2021

(30) Foreign Application Priority Data

Nov. 14, 2019   (KR) .................. 10-2019-0146173

(51) Int. Cl.
   *H03K 3/3562* (2006.01)
   *H03K 3/037* (2006.01)
   *H03K 19/00* (2006.01)

(52) U.S. Cl.
   CPC ......... *H03K 3/0372* (2013.01); *H03K 3/3562* (2013.01); *H03K 19/0002* (2013.01)

(58) Field of Classification Search
   CPC .......... H03K 3/02; H03K 3/027; H03K 3/037; H03K 3/0372; H03K 3/356; H03K 3/356017; H03K 3/356052; H03K 3/356086; H03K 3/356104; H03K 3/356113; H03K 3/3562; H03K 3/35625; H03K 19/0002
   See application file for complete search history.

(56) References Cited

U.S. PATENT DOCUMENTS

| | | | |
|---|---|---|---|
| 5,905,393 A * | 5/1999 | Rinderknecht | H03K 3/356121 327/210 |
| 6,252,448 B1 | 6/2001 | Schober | |
| 7,908,500 B2 | 3/2011 | Westwick et al. | |
| 9,641,160 B2 | 5/2017 | Agarwal et al. | |
| 9,948,282 B2 | 4/2018 | Huang | |
| 10,205,440 B2 | 2/2019 | Reddy et al. | |
| 10,404,240 B2 * | 9/2019 | Kim | H03K 3/0375 |
| 2015/0236676 A1 | 8/2015 | Cai et al. | |
| 2017/0170829 A1 | 6/2017 | Liu et al. | |
| 2017/0194943 A1 | 7/2017 | Nandi et al. | |
| 2017/0222633 A1 * | 8/2017 | Kim | H03K 3/35625 |

* cited by examiner

*Primary Examiner* — Long Nguyen

(74) *Attorney, Agent, or Firm* — Harness, Dickey & Pierce, P.L.C.

(57) ABSTRACT

A flip-flop includes an input switching circuit configured to output an intermediate signal based on an input signal and at least one of a phase of a clock signal or a phase of an inverted clock signal, the phase of the inverted clock signal being opposite to the phase of the clock signal, and block application of a driving voltage to at least one circuit element of the input switching circuit in response to receiving a reset signal representing a reset operation of the flip-flop, and a latch circuit configured to generate an output signal based on the intermediate signal according to the at least one of the phase of the clock signal or the phase of the inverted clock signal.

14 Claims, 17 Drawing Sheets

FLIP-FLOP, MASTER-SLAVE FLIP-FLOP, AND OPERATING METHOD THEREOF

CROSS-REFERENCE TO RELATED APPLICATION

This application claims the benefit of priority to Korean Patent Application No. 10-2019-0146173, filed on Nov. 14, 2019, in the Korean Intellectual Property Office, the disclosure of which is incorporated herein in its entirety by reference.

BACKGROUND

The inventive concepts relate to a flip-flop, a master-slave flip-flop, and an operating method thereof, and particularly, to a flip-flop for operating with low power, a master-slave flip-flop, and an operating method thereof.

Recently, an increase in the market for mobile devices, such as smartphones and tablet personal computers (PCs), has increased the demand for low-power chips. The low-power chips are characterized in that mobile devices including a low-power chip operate based on appropriate performance with limited energy for a long time.

The low-power chips for processing digital signals include flip-flops. The flip-flops are used as data storage devices, and the data storage devices are used to store a state. Each of the flip-flops is an electronic circuit for storing and maintaining 1-bit information and is a basic element of a sequential logic circuit.

As power consumed by flip-flops included in a low-power chip increases, the power consumption of a mobile device including the low-power chip increases. Therefore, a design of a flip-flop with reduced power consumption is desired for securing performance of mobile devices.

SUMMARY

The inventive concepts provide a method and apparatus for decreasing the power consumption of a flip-flop, in a flip-flop, a master-slave flip-flop, and an operating method thereof.

According to an aspect of the inventive concepts, there is provided a flip-flop including an input switching circuit configured to output an intermediate signal based on an input signal and at least one of a phase of a clock signal or a phase of an inverted clock signal, the phase of the inverted clock signal being opposite to the phase of the clock signal, and block application of a driving voltage to at least one circuit element of the input switching circuit in response to receiving a reset signal representing a reset operation of the flip-flop, and a latch circuit configured to generate an output signal based on the intermediate signal according to the at least one of the phase of the clock signal or the phase of the inverted clock signal.

According to an aspect of the inventive concepts, there is provided a flip-flop including an input switching circuit configured to output an intermediate signal based on an input signal and at least one of a phase of a clock signal or a phase of an inverted clock signal, the phase of the inverted clock signal being opposite to the phase of the clock signal, a latch circuit configured to generate an output signal based on the intermediate signal according to the at least one of the phase of the clock signal or the phase of the inverted clock signal, and a blocking circuit configured to block application of a driving voltage to at least one first transistor included in the input switching circuit and at least one second transistor included in the latch circuit in response to receiving a reset signal representing a reset operation of the flip-flop.

According to an aspect of the inventive concepts, there is provided a master-slave flip-flop including a master latch including a master input switching circuit configured to output a master intermediate signal to a master middle node based on a master input signal and at least one of a phase of a clock signal or a phase of an inverted clock signal, the phase of the inverted clock signal being opposite to the phase of the clock signal, and block charging of the master middle node in response to receiving a reset signal having a logic level, and a master latch circuit connected to the master middle node, the master latch circuit being configured to output a slave input signal based on the master intermediate signal, and a slave latch configured to output an output signal synchronized with the at least one of the clock signal or the inverted clock signal based on the slave input signal provided from the master latch.

According to an aspect of the inventive concepts, there is provided a master-slave flip-flop including a master latch including an input switching circuit including at least one first transistor, the input switching circuit being configured to output an intermediate signal to a middle node based on a master input signal and at least one of a phase of a clock signal or a phase of an inverted clock signal, the phase of the inverted clock signal being opposite to the phase of the clock signal, a latch circuit including at least one second transistor, the latch circuit being connected to the middle node, and the latch circuit being configured to output a slave input signal based on the intermediate signal, and a blocking circuit configured to block application of a driving voltage to the at least one first transistor and the at least one second transistor in response to receiving a reset signal representing a logic level, and a slave latch configured to output an output signal synchronized with the at least one of the clock signal or the inverted clock signal based on the slave input signal provided from the master latch.

According to an aspect of the inventive concepts, there is provided an operating method of a master-slave flip-flop including a master latch and a slave latch, the operating method including disconnecting a driving voltage node from at least one circuit element of an input switching circuit included in the master latch based on a received reset signal representing a reset operation of the master-slave flip-flop, and blocking charging and discharging of an output node of the input switching circuit and electrical nodes included in the slave latch based on the disconnecting.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Hereinafter, embodiments will be described in detail with reference to the accompanying drawings.

Figure 1:
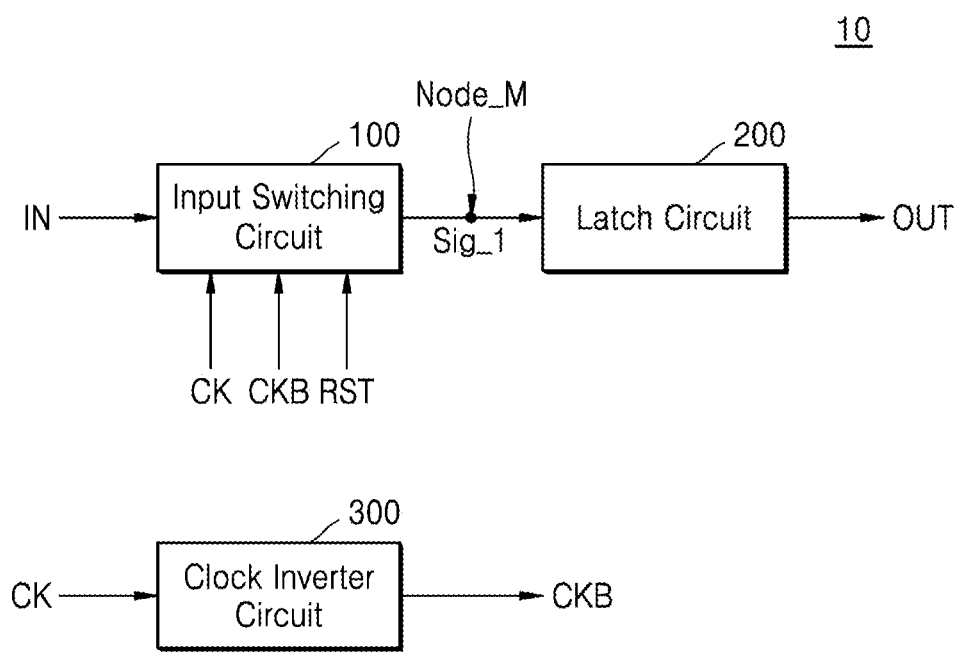
FIG. 1 is a diagram illustrating a flip-flop according to an embodiment.

FIG. 1 illustrates a flip-flop 10 according to an embodiment. The flip-flop 10 may include an input switching circuit 100, a latch circuit 200, and/or a clock inverter circuit 300. The flip-flop 10 may be included in various electronic circuits, integrated circuits, chips, and/or devices, which process digital signals.

The flip-flop 10 may be triggered at a rising edge of a clock signal CK. For example, the flip-flop 10 may output, as an output signal OUT, an input signal IN latched at the rising edge of the clock signal CK. The flip-flop 10 may be implemented as a flip-flop of one bit or as a multibit flip-flop of two or more bits. The flip-flop 10 may have a set function of setting the output signal OUT to a first logic level (for example, '1') and may have a reset function of resetting the output signal OUT to a second logic level (for example, '0'). In an embodiment, the flip-flop 10 may include a retention function of maintaining data. Also, it has been described above that the flip-flop 10 outputs, as the output signal OUT, the input signal IN latched at the rising edge of the clock signal CK, but some example embodiments are not limited thereto. According to some example embodiments, the flip-flop 10 may output, as the output signal OUT, the input signal IN latched at a falling edge of the clock signal CK (e.g., a rising edge of an inverted clock signal CKB).

The clock inverter circuit 300 may generate the inverted clock signal CKB on the basis of the clock signal CK and may output the inverted clock signal CKB. For example, the clock inverter circuit 300 may provide the inverted clock signal CKB to the input switching circuit 100 and/or the latch circuit 200. To this end, the clock inverter circuit 300 may be implemented with an inverter configured to invert the clock signal CK.

The input switching circuit 100 may output a first signal Sig_1 to a middle node Node_M on the basis of an input signal IN input to the flip-flop 10. Here, the middle node Node_M may be an electrical node connected to the input switching circuit 100 and the latch circuit 200 in common and may represent an electrical node to which the first signal Sig_1 is transferred. Herein, the first signal Sig_1 may be referred to as an intermediate signal. The first signal Sig_1 may be a signal synchronized with the clock signal CK or the inverted clock signal CKB and may be the input signal IN or an inverted input signal IN. In other words, the input switching circuit 100 may output the input signal IN as the first signal Sig_1 on the basis of phases of the clock signal CK and/or the inverted clock signal CKB, or may invert the input signal IN on the basis of the phases of the clock signal CK or the inverted clock signal CKB to output the first signal Sig_1. To this end, the input switching circuit 100 may include a transmission gate, a tri-state inverter, etc. This will be described below in more detail with reference to FIGS. 4A-4B.

As described above, the input switching circuit 100 may include at least one transistor, for outputting the first signal Sig_1 on the basis of the phases of the clock signal CK and/or the inverted clock signal CKB. The at least one transistor may be driven with a driving voltage. Also, the at least one transistor may be connected between a driving voltage node for providing the driving voltage and a ground node for providing a ground voltage. The input switching circuit 100 may turn on and/or off the at least one transistor connected between the driving voltage node and the ground node to charge and/or discharge the middle node Node_M, thereby outputting the first signal Sig_1.

Since the output signal OUT is fixed independently from the input signal IN in a reset operation of the flip-flop 10, the input switching circuit 100 may output the first signal Sig_1, varying based on the input signal IN, to the middle node Node_M during the reset operation, and thus, charging or discharging of the middle node Node_M may not be useful. On the other hand, due to a parasitic capacitor of the middle node Node_M, charging or discharging of the middle node Node_M may cause undesired power consumption.

Therefore, the input switching circuit 100 according to an embodiment may receive a reset signal RST. The input switching circuit 100 may prevent the driving voltage from being applied to, or reduce the amount of driving voltage applied to, at least one circuit element (for example, the at least one transistor) connected between the driving voltage node and the ground node, in response to an input of the reset signal RST having the first logic level (for example, '1') representing the reset operation of the flip-flop 10. To this end, in an embodiment, the input switching circuit 100 may include a blocking circuit (120 of FIG. 3) configured to selectively block a connection between the at least one transistor and the driving voltage node on the basis of a logic level of the reset signal RST. In an embodiment, the blocking circuit may include a PMOS transistor including a gate to which the reset signal RST is applied.

The latch circuit 200 may output the output signal OUT on the basis of the first signal Sig_1. According to an embodiment, the latch circuit 200 may output, as the output signal OUT, the first signal Sig_1 latched at the rising edge or falling edge of the clock signal CK and may output, as the output signal OUT, an inverted first signal Sig_1 latched at the rising edge or falling edge of the clock signal CK. To this end, the latch circuit 200 may include an inverter circuit and/or a keeper circuit. This will be described below in more detail with reference to FIGS. 2A and 2B. In an embodiment, the latch circuit 200 may include at least one transistor connected between the driving voltage node and the ground node, and moreover, the latch circuit 200 may include a second blocking circuit configured to selectively block a connection between the at least one transistor and the driving voltage node in the reset operation of the flip-flop 10. In an embodiment, the second blocking circuit may include a PMOS transistor including a gate to which the reset signal RST is input. According to some example embodiments, the input signal IN, the clock signal CK and/or the reset signal RST may be input from, and/or the output signal OUT may be output to, a different component within a device (e.g., a mobile device) containing the flip-flop 10 and/or external to the device. For example, the input signal IN, the clock signal CK and/or the reset signal RST may be input from, and/or the output signal OUT may be output to, processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. According to some example embodiments, the clock signal CK may be output by a local oscillator circuit included in, or external to, a device containing the flip-flop 10.

In the flip-flop 10 according to an embodiment, as the input switching circuit 100 receives the reset signal RST representing the reset operation, charging and/or discharging of the middle node Node_M may be prevented or reduced, and thus, charging and/or discharging of all electrical nodes disposed at a rear end of the middle node Node_M with respect to a signal transfer direction may be blocked. Therefore, undesired charging and/or discharging performed in the flip-flop 10 may stop in the reset operation of the flip-flop 10, thereby decreasing power consumption caused by the undesired charging and/or discharging. Accordingly, total power consumed by the flip-flop 10 may be reduced. As used herein, the term "blocked" may refer to complete blocking or partial (e.g., substantial) blocking, and the term "stop" may refer to completely stopping or partially (e.g., substantially) stopping.

Figure 2A:
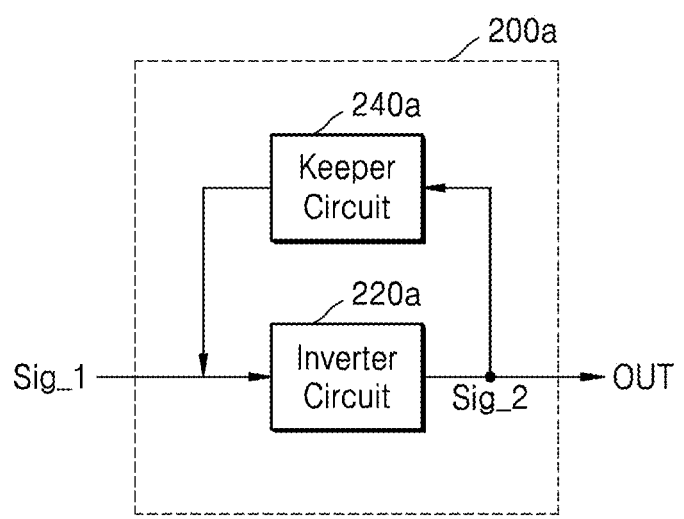
FIGS. 2A and 2B are diagrams respectively illustrating a latch circuit according to an embodiment.
Figure 2B:
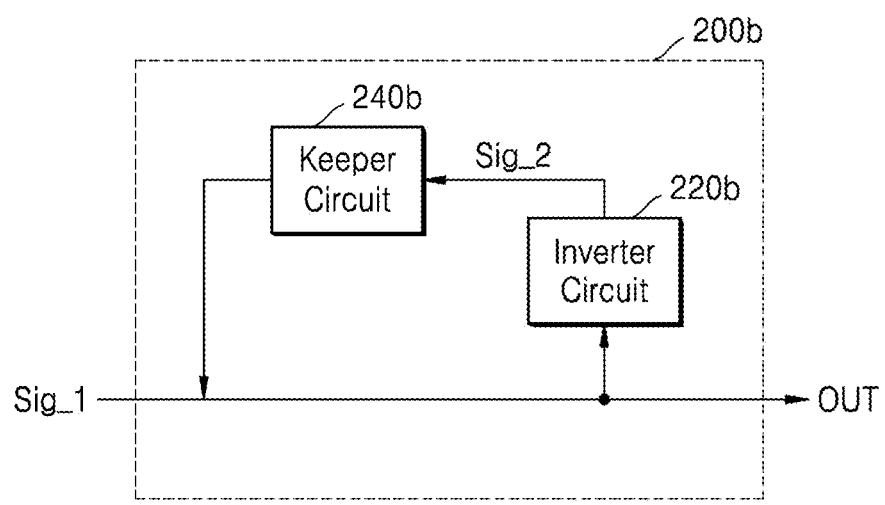

FIGS. 2A and 2B are diagrams respectively illustrating latch circuits 200a and 200b according to an embodiment. FIGS. 2A and 2B will be described below in conjunction with FIG. 1.

Referring to FIG. 2A, the latch circuit 200a may include an inverter circuit 220a and/or a keeper circuit 240a.

The inverter circuit 220a may invert the first signal Sig_1 to generate a second signal Sig_2 and may output the second signal Sig_2 as the output signal OUT (e.g. to a different component within a device containing the flip-flop 10 and/or external to the device). Also, the inverter circuit 220a may provide the second signal Sig_2 to the keeper circuit 240a. In an embodiment, the inverter circuit 220a may include an inverter configured to invert the first signal Sig_1 to generate the second signal Sig_2.

The keeper circuit 240a may invert the second signal Sig_2 to output the first signal Sig_1. In an embodiment, the keeper circuit 240a may operate based on the clock signal CK and/or the inverted clock signal CKB and may be implemented with a tri-state inverter configured to invert the second signal Sig_2 to output the first signal Sig_1.

Referring to FIG. 2B, the latch circuit 200b may include an inverter circuit 220b and/or a keeper circuit 240b.

The latch circuit 200b may output the first signal Sig_1 as the output signal OUT (e.g. to a different component within a device containing the flip-flop 10 and/or external to the device).

The inverter circuit 220b may invert the first signal Sig_1 to generate the second signal Sig_2 and may provide the second signal Sig_2 to the keeper circuit 240b. In an embodiment, the inverter circuit 220b may be implemented with an inverter configured to invert the first signal Sig_1 to output the second signal Sig_2.

The keeper circuit 240b may invert the second signal Sig_2 to output the first signal Sig_1. In an embodiment, the keeper circuit 240b may operate based on the clock signal CK and/or the inverted clock signal CKB and may be implemented with a tri-state inverter configured to invert the second signal Sig_2 to output the first signal Sig_1.

Figure 3:
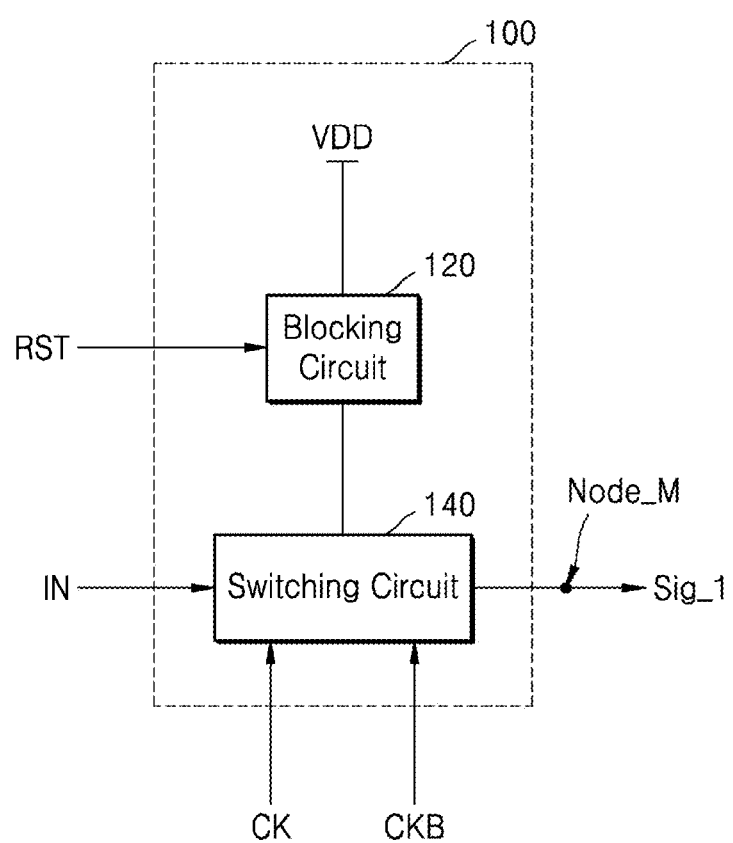
FIG. 3 is a diagram illustrating an input switching circuit according to an embodiment.

FIG. 3 illustrates an input switching circuit 100 according to an embodiment. FIG. 3 will be described below in conjunction with FIG. 1.

The input switching circuit 100 may include a blocking circuit 120 and/or a switching circuit 140.

The switching circuit 140 may output the first signal Sig_1 to the middle node Node_M on the basis of the input signal IN according to the phases of the clock signal CK and/or the inverted clock signal CKB. For example, the switching circuit 140 may output, as the first signal Sig_1, the input signal IN latched at the rising edge of the clock signal CK. However, some example embodiments are not limited thereto, and the switching circuit 140 may output, as the first signal Sig_1, an inverted input signal IN latched at the rising edge of the clock signal CK. In an embodiment, the switching circuit 140 may be implemented with a transmission gate, a tri-state inverter, and/or the like. Also, in an embodiment, the switching circuit 140 may include at least one transistor.

The blocking circuit 120 may be connected between a driving voltage node VDD and the switching circuit 140. Particularly, the blocking circuit 120 may be connected between the driving voltage node VDD and the at least one transistor of the switching circuit 140. The blocking circuit 120 may selectively block an electrical connection between the driving voltage node VDD and the switching circuit 140 on the basis of a reset signal RST. In other words, the blocking circuit 120 may electrically connect the driving voltage node VDD to the switching circuit 140 and/or may disconnect (or open) the driving voltage node VDD from the switching circuit 140, on the basis of a level represented by the reset signal RST. For example, the blocking circuit 120 may disconnect the driving voltage node VDD from the switching circuit 140 in response to receiving the reset signal RST representing the reset operation of the flip-flop 10, and thus, may block an electrical connection between the driving voltage node VDD and the at least one transistor of the switching circuit 140. Here, the reset signal RST representing the reset operation may correspond to the reset signal RST representing the first logic level (for example, '1'). On the other hand, when the reset signal RST having the second logic level (for example, '0'), which does not represent the reset operation, is input, the blocking circuit 120 may form an electrical connection between the driving voltage node VDD and the switching circuit 140.

In the input switching circuit 100 according to an embodiment, an electrical connection between the driving voltage node VDD and the at least one transistor of the switching circuit 140 may be blocked in the reset operation of the flip-flop 10, and thus, the switching circuit 140 may not charge and/or discharge the middle node Node_M. At this time, in an embodiment, the first signal Sig_1 may represent a ground voltage level or a voltage level fluctuating near the ground voltage level. Therefore, undesired power consumption caused by undesired charging and/or discharging may be reduced in the reset operation of the flip-flop 10.

Figure 4A:
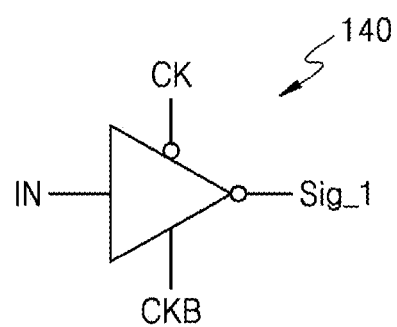
FIG. 4A illustrates, as a symbol, an embodiment where a switching circuit is implemented with a tri-state inverter.
Figure 4B:
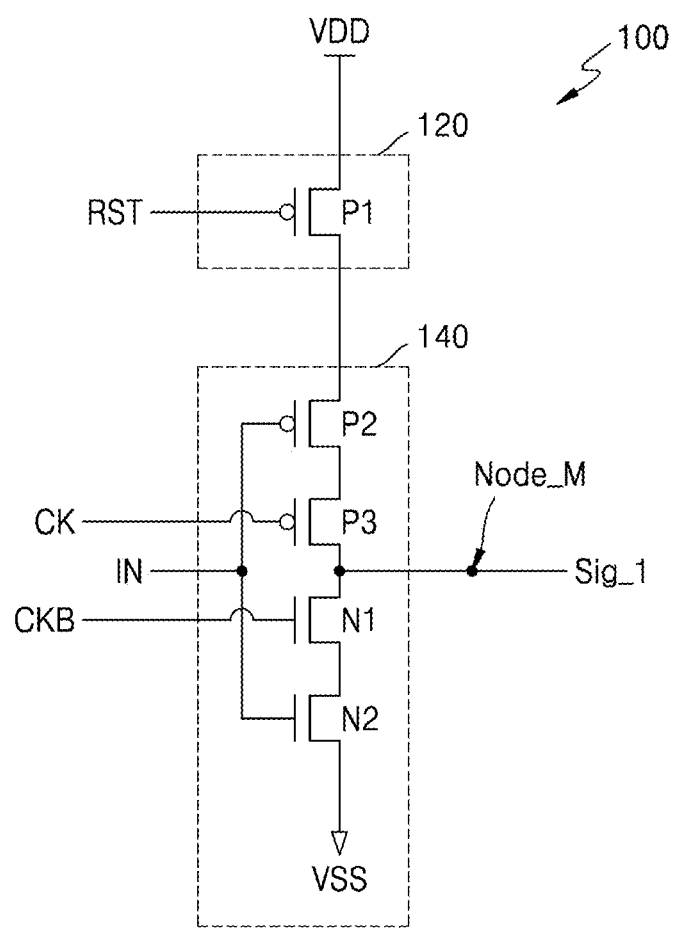
FIG. 4B illustrates an embodiment of a transistor-level circuit diagram of the input switching circuit.

FIGS. 4A-4B illustrate a switching circuit 140 and an input switching circuit 100 according to an embodiment.

Particularly, FIG. 4A illustrates, as a symbol, an embodiment where the switching circuit 140 is implemented with a tri-state inverter, and FIG. 4B illustrates an embodiment of a transistor-level circuit diagram of the input switching circuit 100.

The switching circuit 140 may include a tri-state inverter which inverts an input signal IN on the basis of phases of a clock signal CK or an inverted clock signal CKB to output a first signal Sig_1. Also, in an embodiment, the switching circuit 140 may include a PMOS transistor P2, a PMOS transistor P3, an NMOS transistor N1, and/or an NMOS transistor N2, which are serially connected to one another. The PMOS transistor P2, the PMOS transistor P3, the NMOS transistor N1, and/or the NMOS transistor N2 may be connected to one another by using a cascode connection manner. The input signal IN may be input to gates of the PMOS transistor P2 and the NMOS transistor N2, the clock signal CK may be input to a gate of the PMOS transistor P3, and the inverted clock signal CKB may be input to a gate of the NMOS transistor N1. A source of the NMOS transistor N2 may be connected to a ground node VSS. A drain of the PMOS transistor P3 and a drain of the NMOS transistor N1 may be connected to a middle node Node_M. A source of the PMOS transistor P2 may be connected to a blocking circuit 120.

The blocking circuit 120 may include a PMOS transistor P1. A reset signal RST may be input to a gate of the PMOS transistor P1. When the reset signal RST having a first logic level representing a reset operation of a flip-flop is input to the gate of the PMOS transistor P1, the PMOS transistor P1 may be turned off, and an electrical connection between a driving voltage node VDD and the PMOS transistor P2 may be blocked. In other words, in the reset operation of the flip-flop, a source of the PMOS transistor P2 may be floated. Therefore, charging and/or discharging of the middle node Node_M may be blocked.

Referring to FIG. 4B, the PMOS transistor P1 included in the blocking circuit 120 may be connected to the transistors included in the switching circuit 140 in a cascode form. For example, the PMOS transistor P1 may be connected to the PMOS transistor P2 in the cascode form. According to some example embodiments, a drain of the PMOS transistor P1 may be connected to a source of the PMOS transistor P2, and a source of the PMOS transistor P1 may be connected to the driving voltage node VDD.

Figure 5:
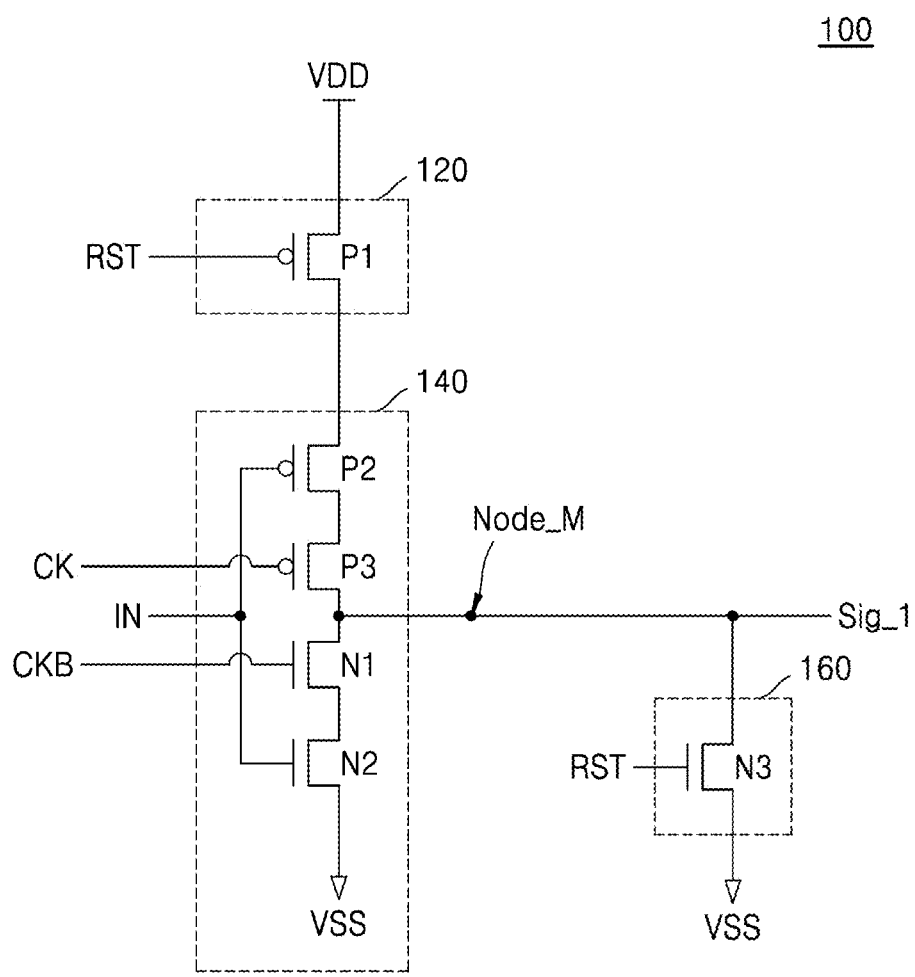
FIG. 5 is a diagram illustrating an input switching circuit including a ground connecting circuit according to an embodiment.

FIG. 5 illustrates an input switching circuit 100 according to an embodiment. FIG. 5 will be described below in conjunction with FIGS. 1 and 4.

As described above with reference to FIG. 4B, the input switching circuit 100 may include a blocking circuit 120 and/or a switching circuit 140. The blocking circuit 120 may include a PMOS transistor P1, and the switching circuit 140 may be implemented with a tri-state inverter including a PMOS transistor P2, a PMOS transistor P3, an NMOS transistor N1, and/or an NMOS transistor N2, which are connected to one another in a cascode form. In describing the blocking circuit 120 and the switching circuit 140, descriptions which are the same as or similar to the descriptions of FIG. 4B are omitted.

The input switching circuit 100 may further include a ground connecting circuit 160. In a reset operation of the flip-flop 10, the ground connecting circuit 160 may connect a middle node Node_M to a ground node VSS to shift a voltage of the middle node Node_M to a ground voltage. In other words, the ground connecting circuit 160 may selectively form an electrical connection between the middle node Node_M and the ground node VSS on the basis of a reset signal RST. For example, the ground connecting circuit 160 may electrically connect (or short-circuit) the middle node Node_M to the ground node VSS in response to an input of the reset signal RST having a first logic level representing the reset operation. In an embodiment, the ground connecting circuit 160 may include an NMOS transistor N3. The reset signal RST may be input to a gate of the NMOS transistor N3, a drain of the NMOS transistor N3 may be connected to the middle node Node_M, and a source of the NMOS transistor N3 may be connected to the ground node VSS. In response to the reset signal RST having the first logic level representing the reset operation being input to the gate of the NMOS transistor N3, the NMOS transistor N3 may be turned on and may electrically connect the middle node Node_M to the ground node VSS.

In the input switching circuit 100 according to an embodiment, in the reset operation of the flip-flop 10, the blocking circuit 120 may block charging and/or discharging of the middle node Node_M, and simultaneously or contemporaneously, the ground connecting circuit 160 may connect the middle node Node_M to the ground node VSS, thereby allowing the middle node Node_M to hold the ground voltage. Therefore, power consumption occurring in the middle node Node_M may be effectively reduced.

Figure 6:
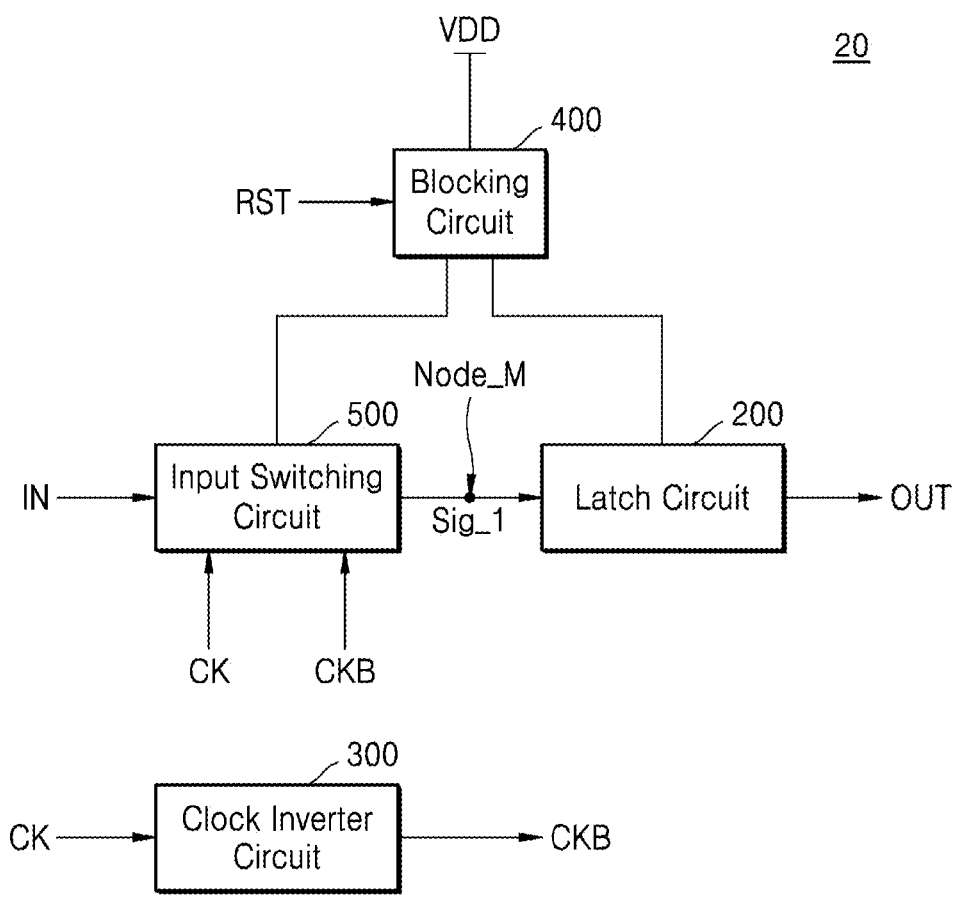
FIG. 6 is a diagram illustrating a flip-flop including a blocking circuit for blocking a connection between a voltage source and both of an input switching circuit and a latch circuit according to an embodiment.

FIG. 6 illustrates a flip-flop 20 according to an embodiment. The flip-flop 20 may include an input switching circuit 500, a latch circuit 200, a clock inverter circuit 300, and/or a blocking circuit 400. In describing the flip-flop 20 of FIG. 6, descriptions which are the same as or similar to descriptions given above with reference to FIGS. 1 to 5 are omitted, and an implementation difference with the flip-flop 10 described above with reference to FIGS. 1 to 5 will be mainly described.

The input switching circuit 500 and the latch circuit 200 of the flip-flop 20 may share the blocking circuit 400. In other words, the input switching circuit 500 may include at least one first transistor connected between a driving voltage node VDD and a ground node, and the latch circuit 200 may include at least one second transistor connected between the driving voltage node VDD and the ground node. In a reset operation of the flip-flop 20, the blocking circuit 400 may block a connection between the driving voltage node VDD and the at least one first transistor, and simultaneously or contemporaneously, may block a connection between the driving voltage node VDD and the at least one second transistor. An implementation example of a transistor-level circuit diagram will be described below in more detail with reference to FIG. 7.

The input switching circuit 500 of the flip-flop 20 may correspond to the switching circuit 140 described above with reference to FIGS. 1 to 5 and may output a first signal Sig_1 on the basis of an input signal IN according to a phase of a clock signal CK and/or a phase of an inverted clock signal CKB. The latch circuit 200 may correspond to the latch circuit 200 described above with reference to FIGS. 1 to 5 and may output an output signal OUT on the basis of the first signal Sig_1.

The flip-flop 20 according to an embodiment may prevent or reduce undesired charging and/or discharging of the middle node Node_M, and simultaneously or contemporaneously, may prevent or reduce undesired charging and/or discharging of an electrical node of the latch circuit 200. Therefore, the undesired power consumption of the flip-flop 20 may be reduced.

Figure 7:
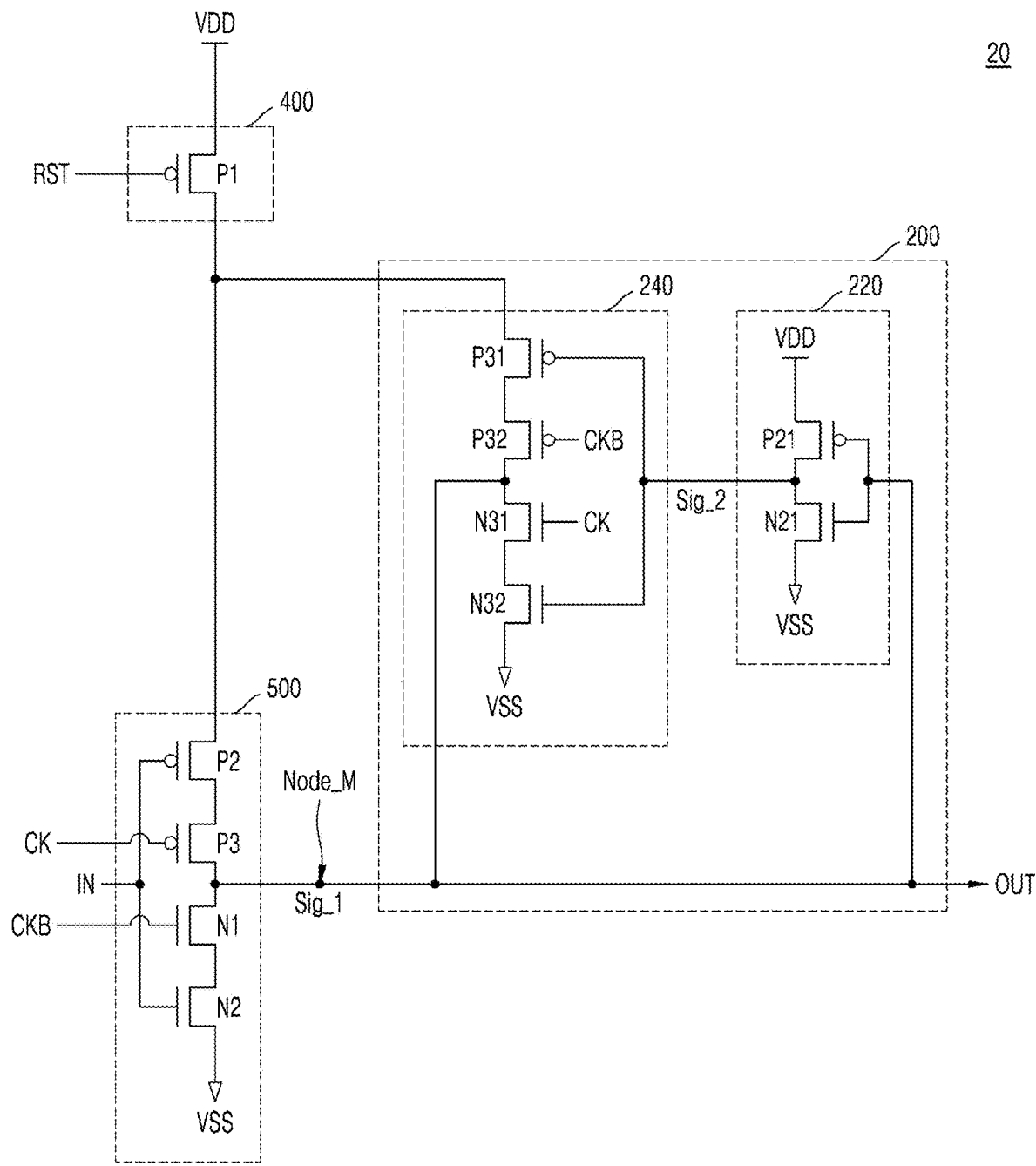
FIG. 7 is a diagram illustrating an embodiment of a transistor-level circuit diagram of the flip-flop of FIG. 6 according to an embodiment.

FIG. 7 illustrates a flip-flop 20 according to an embodiment. Particularly, FIG. 7 illustrates a transistor-level circuit diagram of the flip-flop 20 of FIG. 6. FIG. 7 will be described below in conjunction with FIG. 6.

An input switching circuit 500 may be implemented with a tri-state inverter including a PMOS transistor P2, a PMOS transistor P3, an NMOS transistor N1, and/or an NMOS transistor N2, which are connected to one another in a cascode form. The input switching circuit 500 may be implemented to be substantially equal to the switching circuit 140 of FIG. 4B.

In regard to a latch circuit 200, FIG. 7 illustrates an embodiment which is implemented in the same form as or a similar form to FIG. 2A. The latch circuit 200 may include an inverter circuit 220 and/or a keeper circuit 240.

The inverter circuit 220 may be implemented with an inverter including a PMOS transistor P21 and an NMOS transistor N21, which are serially connected between a driving voltage node VDD and a ground node VSS. A first signal Sig_1 may be input to gates of the PMOS transistor P21 and the NMOS transistor N21. The inverter circuit 220 may output a second signal Sig_2 through a node which is connected to a drain of the PMOS transistor P21 and a drain of the NMOS transistor N21 in common. A source of the PMOS transistor P21 may be connected to the driving voltage node VDD, and a source of the NMOS transistor N21 may be connected to the ground node VSS.

The keeper circuit 240 may be implemented with a tri-state inverter including a PMOS transistor P31, a PMOS transistor P32, an NMOS transistor N31, and an NMOS transistor N32, which are connected to one another in a cascode form. The second signal Sig_2 may be input to gates of the PMOS transistor P31 and the NMOS transistor N32, an inverted clock signal CKB may be input to a gate of the PMOS transistor P32, and a clock signal CK may be input to a gate of the NMOS transistor N31. A source of the NMOS transistor N32 may be connected to the ground node VSS, and a source of the PMOS transistor P31 may be connected to the blocking circuit 400. A drain of the PMOS transistor P32 and a drain of the NMOS transistor N31 may be connected to the middle node Node_M.

The blocking circuit 400 may include a PMOS transistor P1 including a gate to which a reset signal RST is input. A drain of the PMOS transistor P1 may be connected to a source of the PMOS transistor P2 and a source of the PMOS transistor P31, and a source of the PMOS transistor P1 may be connected to the driving voltage node VDD.

In the flip-flop 20 according to an embodiment, the input switching circuit 500 and the latch circuit 200 may share the blocking circuit 400, thereby increasing area efficiency in chip implementation.

Figure 8:
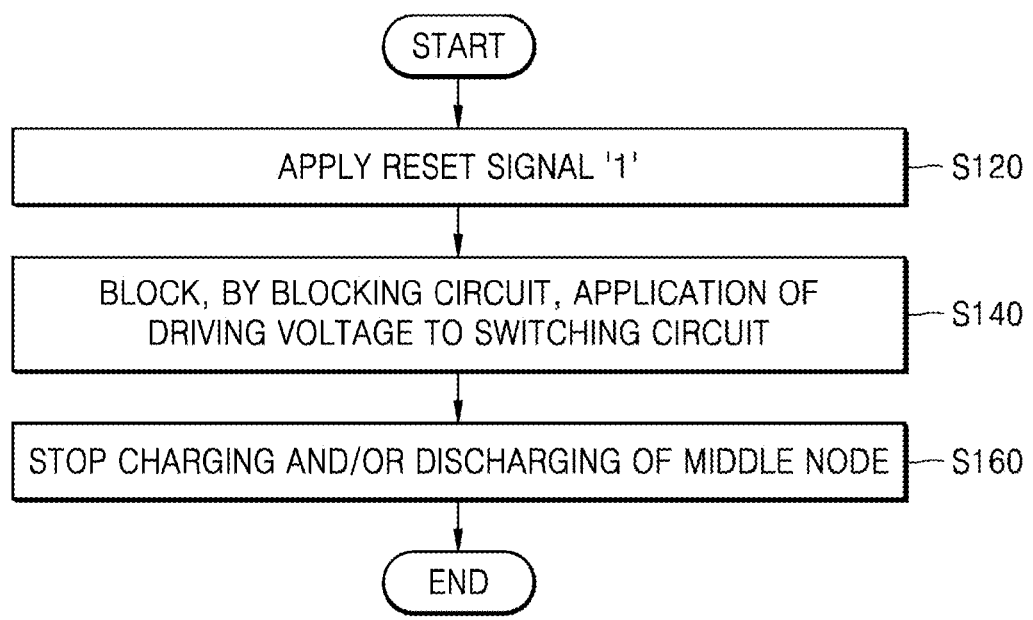
FIG. 8 is a flowchart of an operating method of a flip-flop, according to an embodiment.

FIG. 8 is a flowchart of an operating method of a flip-flop, according to an embodiment. FIG. 8 will be described below in conjunction with FIGS. 1 and 3.

In operation S120, the reset signal RST having the first logic level (for example, '1') representing the reset operation may be applied to the flip-flop 10. In the flip-flop 10 according to an embodiment, the input switching circuit 100 may receive the reset signal RST having the first logic level. For example, the blocking circuit 120 included in the input switching circuit 100 may be turned off according to receiving the reset signal RST having the first logic level.

In operation S140, the application of the driving voltage to the switching circuit 140 may be blocked by the blocking circuit 120. For example, the blocking circuit 120 may be connected to at least one transistor included in the switching circuit 140 and may block the application of the driving voltage to at least one transistor connected between a driving voltage node and a ground node. In other words, the blocking circuit 120 may block an electrical connection between the at least one transistor included in the switching circuit 140 and the driving voltage node VDD in response to receiving the reset signal RST having the first logic level.

In operation S160, charging and/or discharging of the middle node Node_M may stop. Based on operation S140, a connection between the at least one transistor and the driving voltage node VDD may be blocked, and thus, the middle node Node_M may not be charged. Therefore, charging and/or discharging of the middle node Node_M may not be performed in the reset operation of the flip-flop 10.

Figure 9:
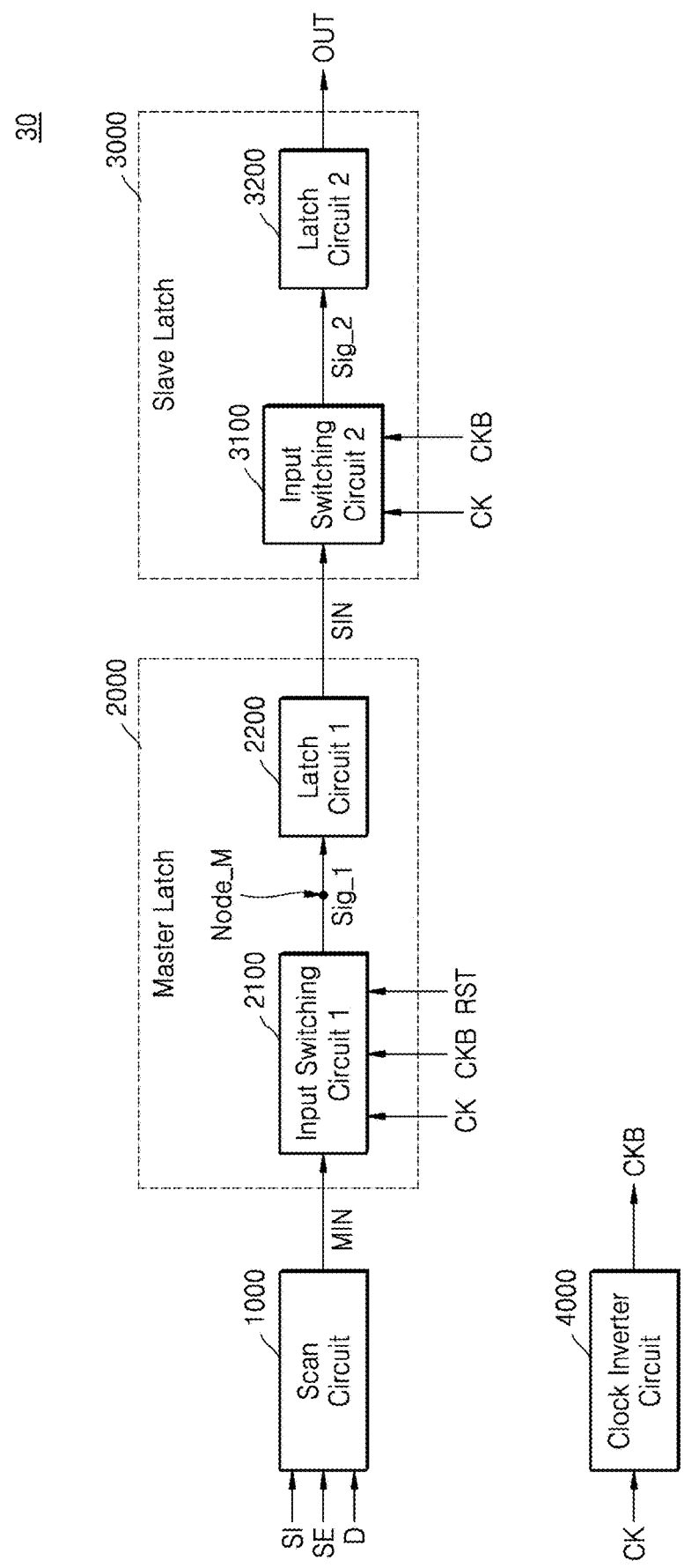
FIG. 9 is a diagram illustrating a master-slave flip-flop according to an embodiment.

FIG. 9 illustrates a master-slave flip-flop 30 according to an embodiment. The master-slave flip-flop 30 may include a scan circuit 1000, a master latch 2000, a slave latch 3000, and/or a clock inverter circuit 4000.

The clock inverter circuit 4000 may generate an inverted clock signal CKB on the basis of a clock signal CK and may output the inverted clock signal CKB. For example, the clock inverter circuit 4000 may provide the inverted clock signal CKB to the master latch 2000 and/or the slave latch 3000. To this end, the clock inverter circuit 4000 may be implemented with an inverter configured to invert the clock signal CK.

The scan circuit 1000 may output one of a data signal D and/or a scan input signal SI as a master input signal MIN on the basis of the data signal D, a scan enable signal SE, and/or the scan input signal SI and may provide the master input signal MIN to the master latch 2000. For example, when the scan enable signal SE has a first logic level (for example, '1'), the scan circuit 1000 may output the scan input signal SI as the master input signal MIN, and when the scan enable signal SE has a second logic level (for example, '0'), the scan circuit 1000 may output the data signal D as the master input signal MIN.

To this end, the scan circuit 1000 may be implemented with at least one of an inverter, a tri-state inverter, a transmission gate, and/or a multiplexer. However, according to embodiments, the scan circuit 1000 may be omitted in the master-slave flip-flop 30. In an embodiment, the data signal D may be provided as the master input signal MIN to the master latch 2000.

The master latch 2000 may output a slave input signal SIN on the basis of the master input signal MIN, the clock signal CK, and/or the inverted clock signal CKB each input thereto. For example, the master latch 2000 may output the master input signal MIN as the slave input signal SIN according to phases of the clock signal CK and/or the inverted clock signal CKB, or may invert the master input signal MIN to output the slave input signal SIN.

The master latch 2000 may include a first input switching circuit 2100 (e.g., "input switching circuit 1") and/or a first latch circuit 2200 (e.g., "latch circuit 1").

The first input switching circuit 2100 may generate a first signal Sig_1 on the basis of the master input signal MIN according to the phases of the clock signal CK and/or the inverted clock signal CKB and may output the first signal Sig_1 to a middle node Node_M to provide the first signal Sig_1 to the first latch circuit 2200. The first latch circuit 2200 may output the slave input signal SIN on the basis of the first signal Sig_1 and may provide the slave input signal SIN to the slave latch 3000.

In an embodiment, the first input switching circuit 2100 may correspond to the input switching circuit 100 described above with reference to FIGS. 1 to 5, and the first latch circuit 2200 may correspond to the latch circuit 200 described above with reference to FIGS. 1 to 5.

The slave latch 3000 may output an output signal OUT on the basis of the slave input signal SIN, the clock signal CK, and/or the inverted clock signal CKB. For example, the slave latch 3000 may output the slave input signal SIN as the output signal OUT according to the phases of the clock signal CK and/or the inverted clock signal CKB, or may invert the slave input signal SIN to output the output signal OUT.

The slave latch 3000 may include a second input switching circuit 3100 (e.g., input switching circuit 2") and/or a second latch circuit 3200 (e.g., "latch circuit 2").

The second input switching circuit 3100 may generate a second signal Sig_2 on the basis of the slave input signal SIN according to the phases of the clock signal CK and/or the inverted clock signal CKB and may provide the second signal Sig_2 to the second latch circuit 3200. The second latch circuit 3200 may output the output signal OUT on the basis of the second signal Sig_2. According to some example embodiments, the second input switching circuit 3100 may correspond to (e.g., may be implemented the same as or similar to) the input switching circuit 100 described above with reference to FIGS. 1 to 5, and the second latch circuit 3200 may correspond to (e.g., may be implemented the same as or similar to) the latch circuit 200 described above with reference to FIGS. 1 to 5.

In an embodiment, like the first input switching circuit 2100 of the master latch 2000, the second input switching circuit 3100 of the slave latch 3000 may be implemented to selectively block an electrical connection between a driving voltage node and at least one circuit element thereof on the basis of a reset signal RST. According to some example embodiments, the input signal IN, the clock signal CK, the data signal D, the scan input signal SI, the scan enable signal SE and/or the reset signal RST may be input from, and/or the output signal OUT may be output to, a different component within a device containing the master-slave flip-flop 30 and/or external to the device. For example, the input signal IN, the clock signal CK, the data signal D, the scan input signal SI, the scan enable signal SE and/or the reset signal RST may be input from, and/or the output signal OUT may be output to, processing circuitry. According to some example embodiments, the clock signal CK may be output by a local oscillator circuit included in, or external to, a device containing the master-slave flip-flop 30.

In the master-slave flip-flop 30 according to an embodiment, the first input switching circuit 2100 of the master latch 2000 may block an electrical connection between the driving voltage node and at least one circuit element of the first input switching circuit 2100, in response to the reset signal RST having a first logic level representing a reset operation. Therefore, charging and/or discharging of the middle node Node_M may be blocked in the reset operation of the master-slave flip-flop 30. Therefore, charging and/or discharging of all electrical nodes disposed at a rear end of the middle node Node_M with respect to a signal transfer direction may be blocked. In other words, in addition to the middle node Node_M, charging and/or discharging of electrical nodes included in the first latch circuit 2200 and the slave latch 3000 may be blocked. Therefore, undesired charging and/or discharging performed in the master-slave flip-flop 30 may stop in the reset operation of the master-slave flip-flop 30, thereby decreasing power consumption caused by the undesired charging and/or discharging. Accordingly, total power consumed by the master-slave flip-flop 30 may be reduced.

Figure 10:
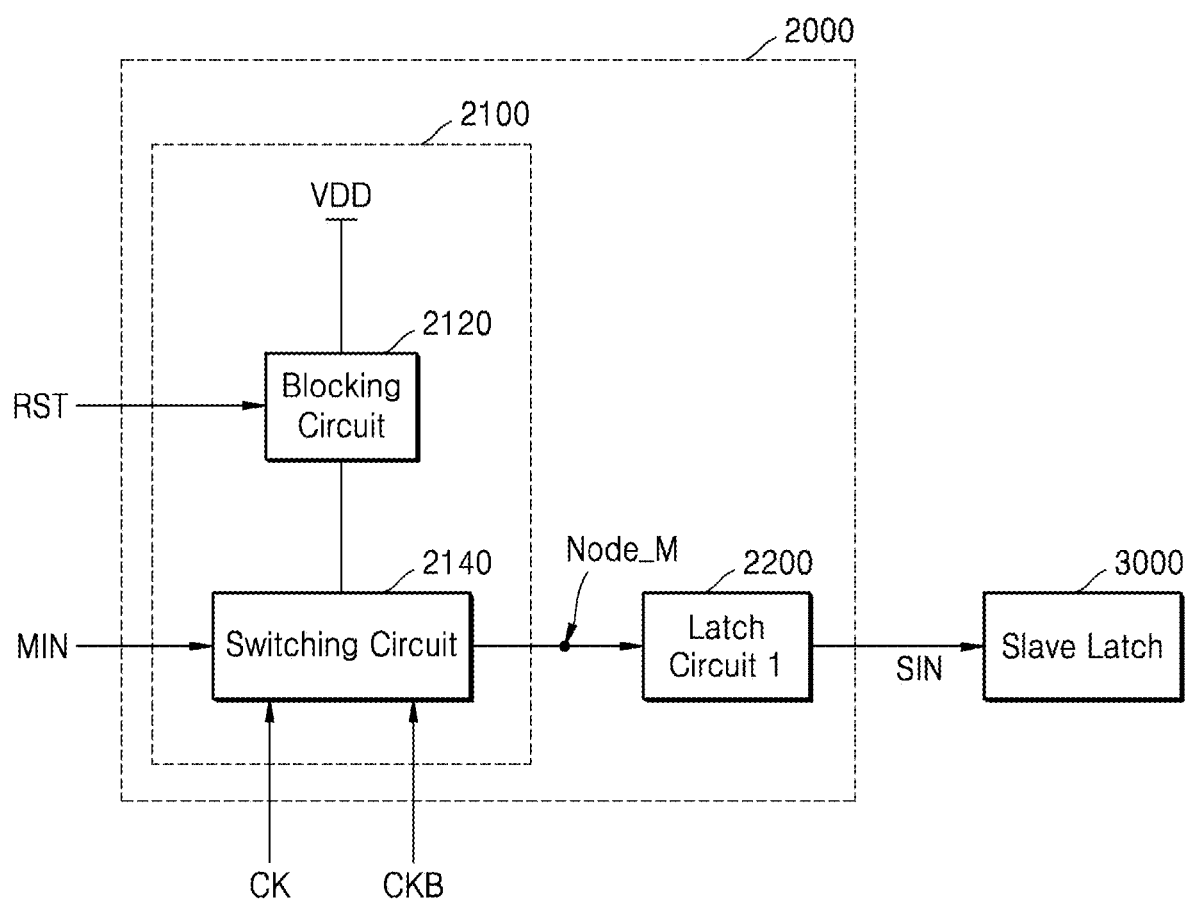
FIG. 10 is a diagram illustrating a master latch and a slave latch in which a first input switching circuit of the master latch includes a blocking circuit and a switching circuit according to an embodiment.

FIG. 10 is a diagram illustrating a master latch 2000 and a slave latch 3000 according to an embodiment. FIG. 10 will be described below in conjunction with FIG. 9.

The first input switching circuit 2100 of the master latch 2000 may include a blocking circuit 2120 and/or a switching circuit 2140. Operations of the blocking circuit 2120 and/or the switching circuit 2140 may respectively correspond to operations of the blocking circuit 120 and/or the switching circuit 140 described above with reference to FIG. 3.

Therefore, the blocking circuit 2120 according to an embodiment may block an electrical connection between the driving voltage node VDD and the switching circuit 2140 in a reset operation of the master-slave flip-flop 30. Accordingly, charging and/or discharging of the middle node Node_M in the master latch 2000 may be blocked. Moreover, charging and/or discharging of electrical nodes of a rear end of the middle node Node_M with respect to a signal transfer direction may be blocked.

Figure 11:
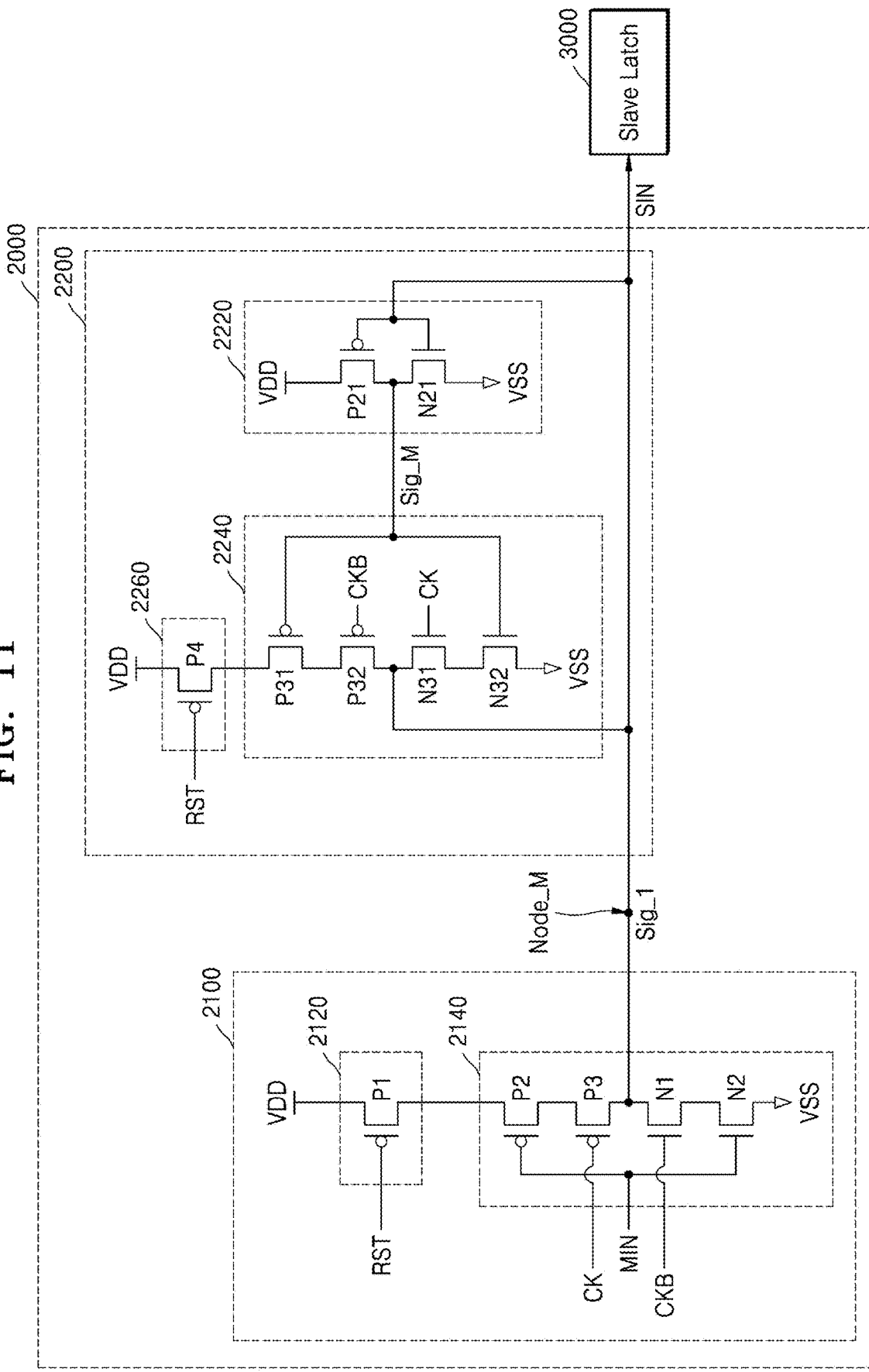
FIG. 11 is a diagram illustrating the master latch and the slave latch of FIG. 10 including a transistor-level circuit diagram of the master latch according to an embodiment.

FIG. 11 illustrates a master latch 2000 and a slave latch 3000 according to an embodiment. Particularly, FIG. 11 illustrates a transistor-level circuit diagram of the master latch 2000 of FIG. 10.

Circuits of the blocking circuit 2120 and/or the switching circuit 2140 may respectively correspond to circuits of the blocking circuit 120 and/or the switching circuit 140 described above with reference to FIG. 4B. In other words, the blocking circuit 2120 may include a PMOS transistor P1 including a gate to which a reset signal RST is input, and/or the switching circuit 2140 may include a PMOS transistor P2, a PMOS transistor P3, an NMOS transistor N1, and/or an NMOS transistor N2, which are connected to one another in a cascode form.

The first latch circuit 2200 may include an inverter circuit 2220, a keeper circuit 2240, and/or a second blocking circuit 2260.

The inverter circuit 2220 may be implemented with an inverter including a PMOS transistor P21 and an NMOS transistor N21, which are serially connected between a driving voltage node VDD and a ground node VSS. A first signal Sig_1 may be input to gates of the PMOS transistor P21 and the NMOS transistor N21. The inverter circuit 2220 may output an intermediate signal Sig_M through a node which is connected to a drain of the PMOS transistor P21 and a drain of the NMOS transistor N21 in common. A source of the PMOS transistor P21 may be connected to the driving voltage node VDD, and a source of the NMOS transistor N21 may be connected to the ground node VSS.

The keeper circuit 2240 may be implemented with a tri-state inverter including a PMOS transistor P31, a PMOS transistor P32, an NMOS transistor N31, and/or an NMOS transistor N32, which are connected to one another in a cascode form. The intermediate signal Sig_M may be input to gates of the PMOS transistor P31 and the NMOS transistor N32, an inverted clock signal CKB may be input to a gate of the PMOS transistor P32, and a clock signal CK may be input to a gate of the NMOS transistor N31. A source of the NMOS transistor N32 may be connected to the ground node VSS, and a source of the PMOS transistor P31 may be connected to the second blocking circuit 2260. A drain of the PMOS transistor P32 and a drain of the NMOS transistor N31 may be connected to a middle node Node_M.

The second blocking circuit 2260 may selectively block an electrical connection between the driving voltage node VDD and the PMOS transistor P31 included in the keeper circuit 2240 on the basis of the reset signal RST. For example, the second blocking circuit 2260 may block an electrical connection between the PMOS transistor P31 and the driving voltage node VDD in a reset operation of the master-slave flip-flop 30. According to some example embodiments, the second blocking circuit 2260 may block an electrical connection between the PMOS transistor P31 and the driving voltage node VDD in response to receiving the reset signal RST having a first logic level (for example, '1').

In an embodiment, the second blocking circuit 2260 may include a PMOS transistor P4 including a gate to which the reset signal RST is input. A source of the PMOS transistor P4 may be connected to the driving voltage node VDD, and a drain of the PMOS transistor P4 may be connected to a source of the PMOS transistor P31. The PMOS transistor P4 may be turned off in response to the reset signal RST having the first logic level being input to a gate thereof, and thus, may block an electrical connection between the driving voltage node VDD and the PMOS transistor P31.

Figure 12:
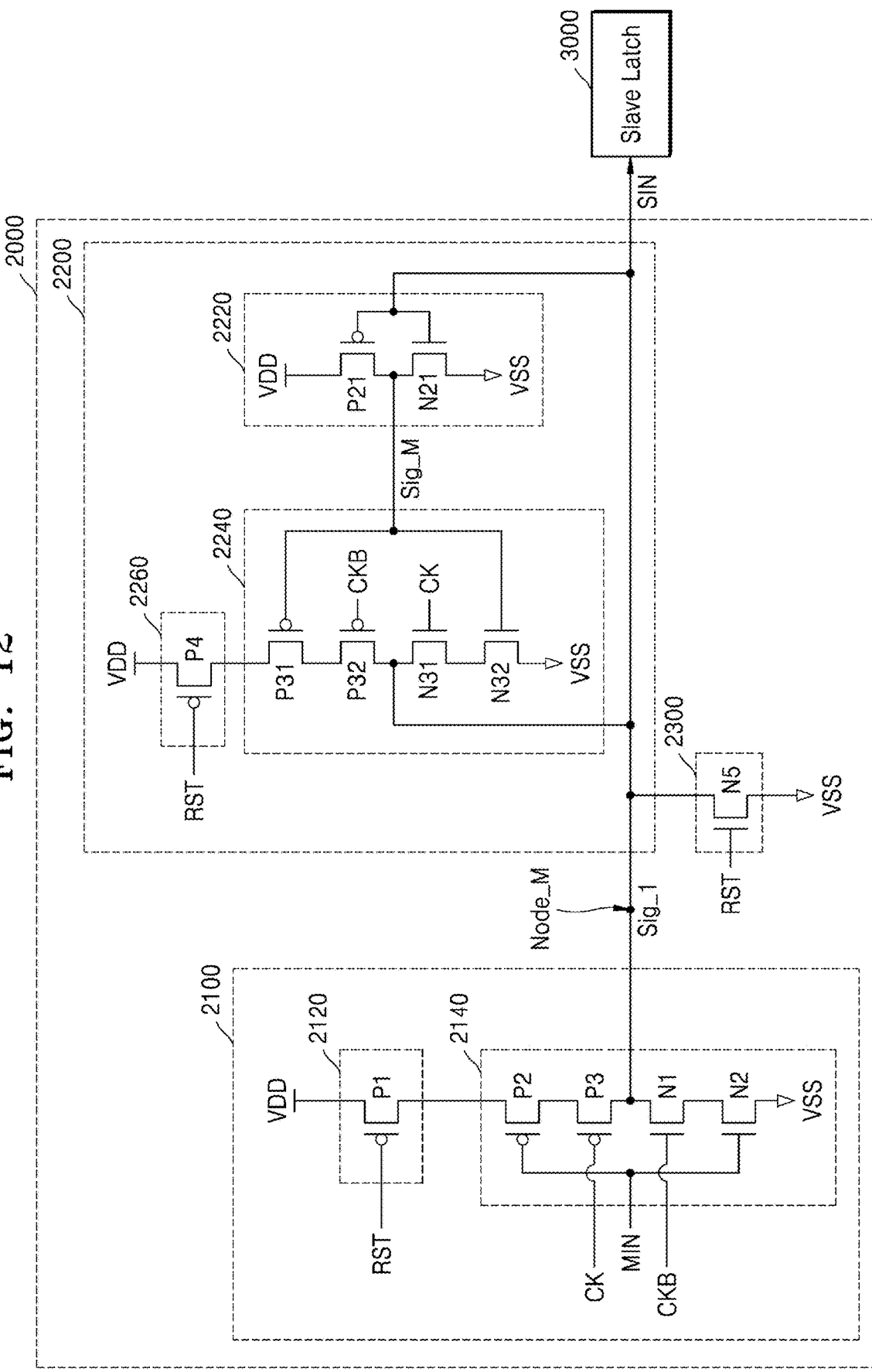
FIG. 12 is a diagram illustrating a master latch and a slave latch in which the master latch includes a ground connecting circuit according to an embodiment.

FIG. 12 illustrates a master latch 2000 and a slave latch 3000 according to an embodiment. FIG. 12 will be described below in conjunction with FIGS. 9 and 11.

In describing a first input switching circuit 2100, a first latch circuit 2200, and/or a slave latch 3000 of FIG. 12, descriptions which are the same as or similar to the descriptions of FIG. 11 are omitted.

The master latch 2000 may further include a ground connecting circuit 2300. In a reset operation of a master-slave flip-flop, the ground connecting circuit 2300 may connect a middle node Node_M to a ground node VSS to shift a voltage of the middle node Node_M to a ground voltage. In other words, the ground connecting circuit 2300 may selectively form an electrical connection between the middle node Node_M and the ground node VSS on the basis of a reset signal RST. For example, the ground connecting circuit 2300 may electrically connect (or short-circuit) the middle node Node_M to the ground node VSS in response to an input of the reset signal RST having a first logic level representing the reset operation. In an embodiment, the ground connecting circuit 2300 may include an NMOS transistor N5. The reset signal RST may be input to a gate of the NMOS transistor N5, a drain of the NMOS transistor N5 may be connected to the middle node Node_M, and a source of the NMOS transistor N5 may be connected to the ground node VSS. In response to the reset signal RST having the first logic level representing the reset operation being input to the gate of the NMOS transistor N5, the NMOS transistor N5 may be turned on and may electrically connect the middle node Node_M to the ground node VSS. According to some example embodiments, the ground connecting circuit 2300 may be included in the first input switching circuit 2100 and/or the switching circuit 2140.

In the master latch 2000 according to an embodiment, in the reset operation of the master-slave flip-flop 30, the blocking circuit 2120 may block charging and/or discharging of the middle node Node_M, and simultaneously or contemporaneously, the ground connecting circuit 2300 may connect the middle node Node_M to the ground node VSS, thereby allowing the middle node Node_M to hold the ground voltage. Therefore, power consumption occurring in the middle node Node_M may be effectively reduced.

Figure 13:
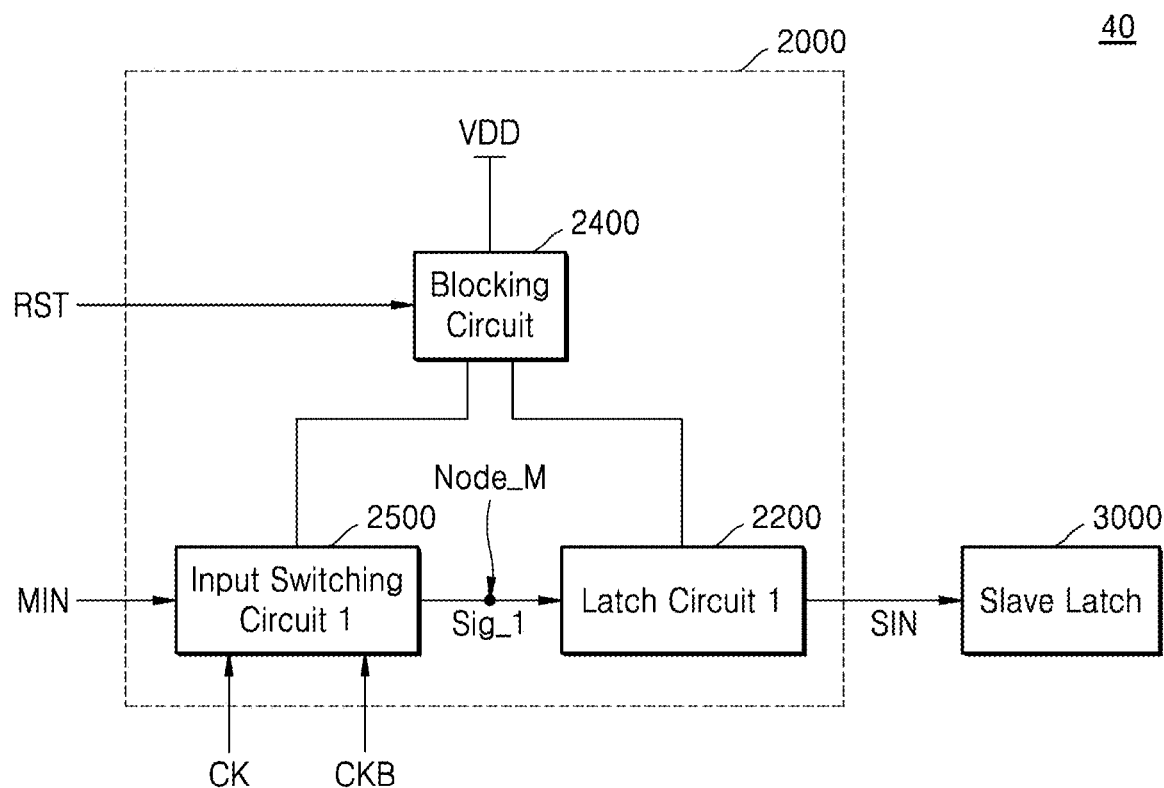
FIG. 13 is a diagram illustrating a master-slave flip-flop having a master latch and a slave latch in which the master latch includes a blocking circuit for blocking a connection between a voltage source and both of a first input switching circuit and a first latch circuit according to an embodiment.

FIG. 13 illustrates a master-slave flip-flop 40 according to an embodiment. FIG. 13 illustrates only a master latch 2000 and a slave latch 3000 among elements of the master-slave flip-flop 40. In describing the master latch 2000 and the slave latch 3000 of FIG. 13, descriptions which are the same as or similar to descriptions given above with reference to FIGS. 9 to 12 are omitted, and an implementation difference with the master latch 2000 described above with reference to FIGS. 9 to 12 will be mainly described.

The master latch 2000 may include a first input switching circuit 2500, a first latch circuit 2200, and/or a blocking circuit 2400.

The first input switching circuit 2500 and the first latch circuit 2200 may share the blocking circuit 2400. In other words, the first input switching circuit 2500 may include at least one first transistor connected between a driving voltage node VDD and a ground node, and the first latch circuit 2200 may include at least one second transistor connected between the driving voltage node VDD and the ground node. In a reset operation of the master-slave flip-flop 40, the blocking circuit 2400 may block a connection between the driving voltage node VDD and the at least one first transistor, and simultaneously or contemporaneously, may block a connection between the driving voltage node VDD and the at least one second transistor. An implementation example of a transistor-level circuit diagram will be described below in more detail with reference to FIG. 14.

The master-slave flip-flop 40 according to an embodiment may prevent or reduce undesired charging and/or discharging of a middle node Node_M, and simultaneously or contemporaneously, may prevent or reduce undesired charging and/or discharging of an electrical node of the first latch circuit 2200. Therefore, the undesired power consumption of the master-slave flip-flop 40 may be reduced.

Figure 14:
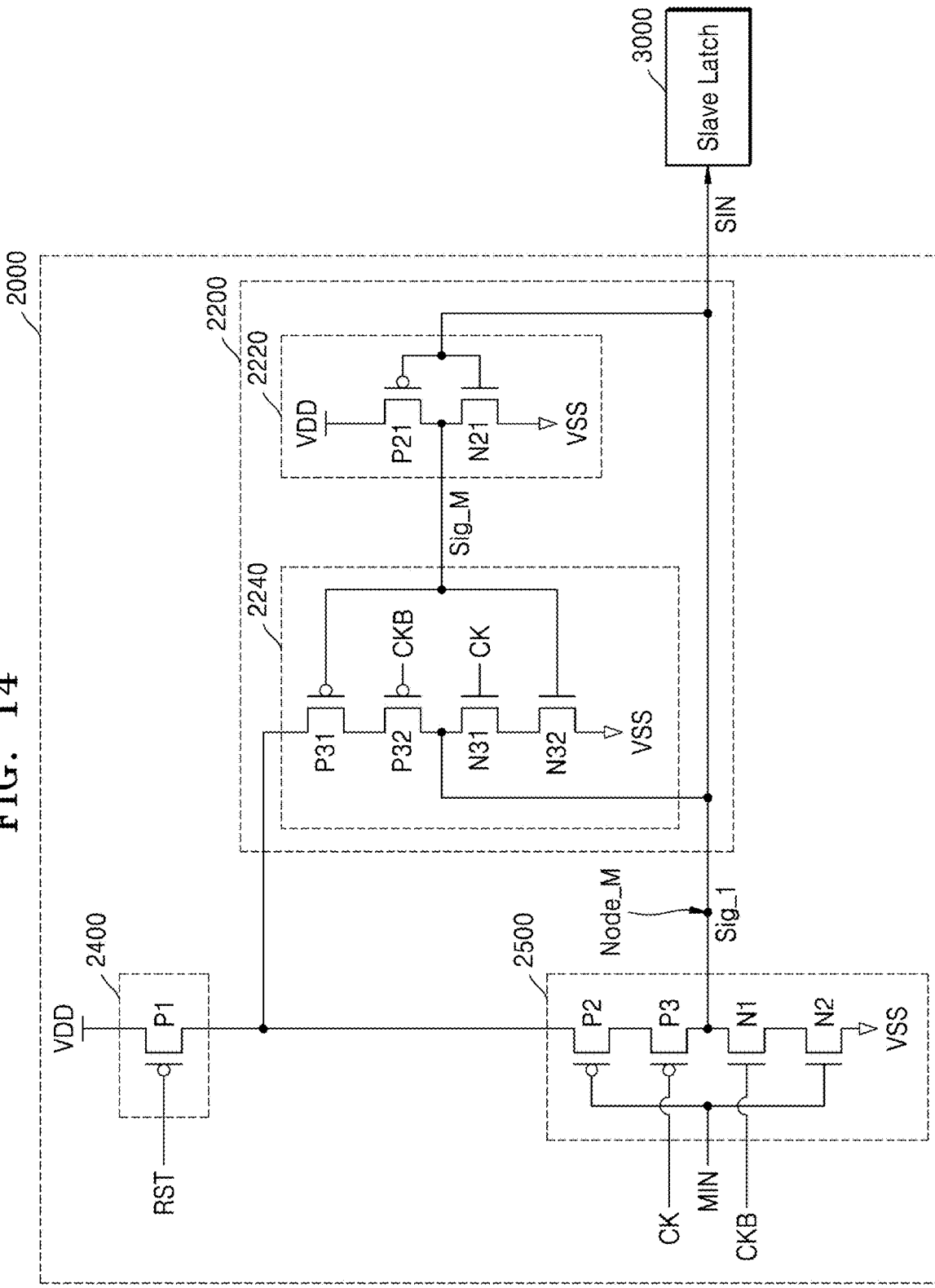
FIG. 14 is a diagram illustrating the master latch and the slave latch of FIG. 13 including a transistor-level circuit diagram of the master latch according to an embodiment.

FIG. 14 illustrates a master latch 2000 and a slave latch 3000 according to an embodiment FIG. 14 will be described below in conjunction with FIG. 13.

Circuits of a first input switching circuit 2500, a first latch circuit 2200, and/or a blocking circuit 2400 of the master latch 2000 may respectively correspond to circuits of the first input switching circuit 500, the latch circuit 200, and/or the blocking circuit 400 described above with reference to FIG. 7.

In the master-slave flip-flop 40 according to an embodiment, the first input switching circuit 2500 and the first latch circuit 2200 may share the blocking circuit 2400, thereby increasing area efficiency in chip implementation.

Figure 15:
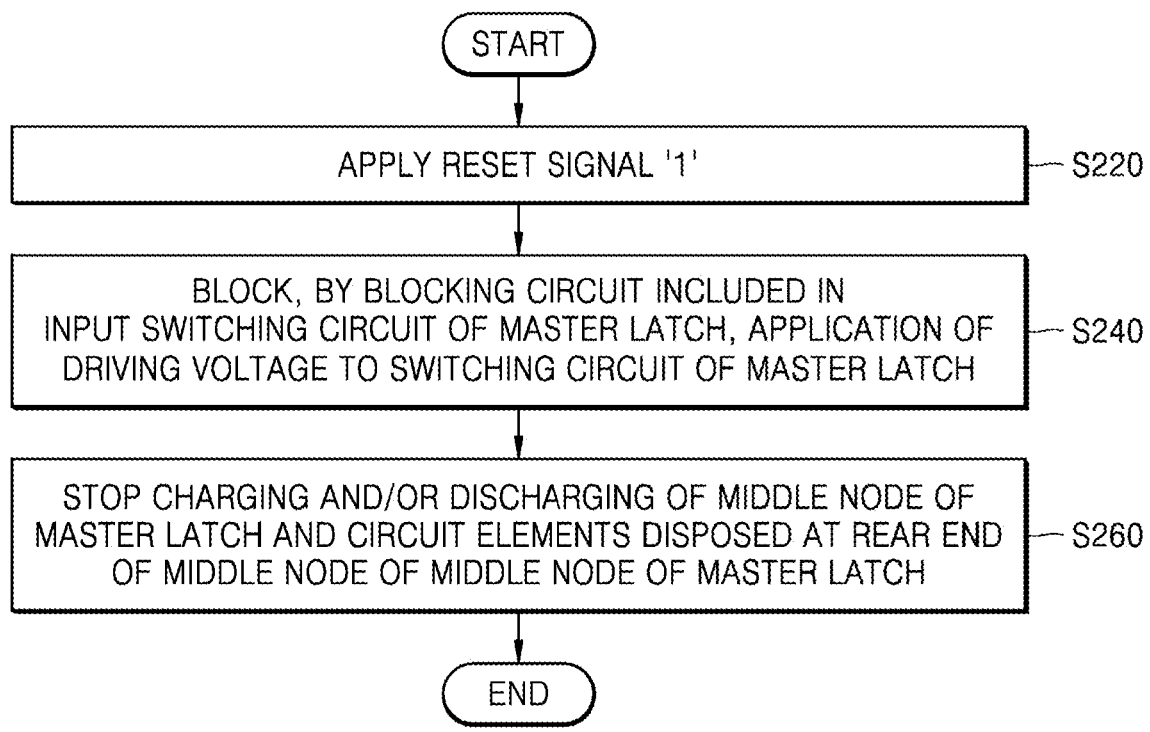
FIG. 15 is a flowchart of an operating method of a master-slave flip-flop, according to an embodiment.

FIG. 15 is a flowchart of an operating method of a master-slave flip-flop, according to an embodiment. FIG. 15 will be described below in conjunction with FIGS. 9 to 12.

In operation S220, the reset signal RST having the first logic level (for example, '1') representing the reset operation may be applied to the master-slave flip-flop 30. In the master-slave flip-flop 30 according to an embodiment, the first input switching circuit 2100 included in the master latch 2000 may receive the reset signal RST having the first logic level. For example, the blocking circuit 2120 included in the first input switching circuit 2100 may be turned off according to receiving the reset signal RST having the first logic level.

In operation S240, the application of the driving voltage to the switching circuit 2140 included in the master latch 2000 may be blocked by the blocking circuit 2120. For example, the blocking circuit 2120 may be connected to at least one transistor included in the switching circuit 2140 and may block the application of the driving voltage to at least one transistor connected between a driving voltage node and a ground node. In other words, the blocking circuit 2120 may block an electrical connection between the at least one transistor included in the switching circuit 2140 and the driving voltage node VDD in response to receiving the reset signal RST having the first logic level.

In operation S260, charging and/or discharging of the middle node Node_M of the master latch 2000 and circuit elements disposed at a rear end of the middle node Node_M may stop. Based on operation S240, a connection between the at least one transistor and the driving voltage node VDD may be blocked, and thus, the middle node Node_M may not be charged. Therefore, charging and/or discharging of the middle node Node_M and circuit elements disposed at the rear end of the middle node Node_M with respect to a signal transfer direction and included in the first latch circuit 2200 and the slave latch 3000 may not be performed in the reset operation of the master-slave flip-flop 30.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail above. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, or in some cases be performed in reverse order.

It will be understood that when an element is referred to as being "connected" or "coupled" to another element, it can be directly connected or coupled to the other element or intervening elements may be present. As used herein the term "and/or" includes any and all combinations of one or more of the associated listed items.

While the inventive concepts have been particularly shown and described with reference to embodiments thereof, it will be understood that various changes in form and details may be made therein without departing from the spirit and scope of the following claims.

What is claimed is:

1. A flip-flop comprising:
   an input switching circuit including a tri-state inverter, the input switching circuit configured to,
     output an intermediate signal using the tri-state inverter based on an input signal and at least one of a phase of a clock signal or a phase of an inverted clock signal, the phase of the inverted clock signal being opposite to the phase of the clock signal, and the clock signal and the inverted clock signal being input to the tri-state inverter, and
     block application of a driving voltage to at least one circuit element of the tri-state inverter in response to receiving a reset signal representing a reset operation of the flip-flop; and
   a latch circuit configured to generate an output signal based on the intermediate signal according to the at least one of the phase of the clock signal or the phase of the inverted clock signal,
   wherein the flip-flop is configured to reset the output signal to logic low in response to the reset signal independently of the input signal.

2. The flip-flop of claim 1, wherein the input switching circuit comprises:

the tri-state inverter; and
a blocking circuit configured to selectively block application of the driving voltage to the tri-state inverter according to a logic level of the reset signal.

3. The flip-flop of claim 2, wherein the blocking circuit comprises:
   a PMOS transistor including a gate configured to receive the reset signal, a source connected to a driving voltage node, and a drain connected to the tri-state inverter.

4. The flip-flop of claim 1, wherein the input switching circuit comprises:
   a ground connecting circuit connected between a ground node and a middle node, the middle node being connected to the input switching circuit and the latch circuit, and the ground connecting circuit being configured to selectively connect the middle node to the ground node according to a logic level of the reset signal.

5. The flip-flop of claim 4, wherein the ground connecting circuit comprises:
   an NMOS transistor including a gate configured to receive the reset signal, a source connected to the ground node, and a drain connected to the middle node.

6. A master-slave flip-flop comprising:
   a master latch including,
     a master input switching circuit including a tri-state inverter, the master input switching circuit configured to,
       output a master intermediate signal to a master middle node using the tri-state inverter based on a master input signal and at least one of a phase of a clock signal or a phase of an inverted clock signal, the phase of the inverted clock signal being opposite to the phase of the clock signal, the clock signal and the inverted clock signal being input to the tri-state inverter, and
       block charging of the master middle node in response to receiving a reset signal having a logic level, and
     a master latch circuit connected to the master middle node, the master latch circuit being configured to output a slave input signal based on the master intermediate signal; and
   a slave latch configured to,
     output an output signal synchronized with the at least one of the clock signal or the inverted clock signal based on the slave input signal provided from the master latch,
   wherein
     the master-slave flip-flop is configured to reset the output signal to logic low in response to the reset signal independently of the master input signal, and
     the master input switching circuit is further configured to block application of a driving voltage to at least one circuit element of the tri-state inverter in response to receiving the reset signal.

7. The master-slave flip-flop of claim 6, wherein the master input switching circuit comprises:
   the tri-state inverter; and
   a first blocking circuit configured to selectively block application of the driving voltage to the tri-state inverter according to the logic level of the reset signal.

8. The master-slave flip-flop of claim 7, wherein the first blocking circuit comprises:
   a PMOS transistor including a gate configured to receive the reset signal, a source connected to a driving voltage node, and a drain connected to the tri-state inverter.

9. The master-slave flip-flop of claim 6, wherein the slave latch comprises:
- a slave input switching circuit configured to output a slave intermediate signal to a slave middle node based on the slave input signal and the at least one of the phase of the clock signal or the phase of the inverted clock signal; and
- a slave latch circuit connected to the slave middle node, the slave latch circuit being configured to output the output signal based on the slave intermediate signal.

10. The master-slave flip-flop of claim 9, wherein the slave input switching circuit comprises:
- a slave switching circuit configured to output the slave intermediate signal based on the slave input signal and the at least one of the phase of the clock signal or the phase of the inverted clock signal; and
- a second blocking circuit configured to selectively block application of a driving voltage to the slave switching circuit according to the logic level of the reset signal.

11. The master-slave flip-flop of claim 6, wherein the master latch comprises:
- a ground connecting circuit connected between a ground node and the master middle node, the master middle node being connected to the master input switching circuit and the master latch circuit, and the ground connecting circuit being configured to selectively connect the master middle node to the ground node according to the logic level of the reset signal.

12. The master-slave flip-flop of claim 11, wherein the ground connecting circuit comprises:
- an NMOS transistor including a gate configured to receive the reset signal, a source connected to the ground node, and a drain connected to the master middle node.

13. The master-slave flip-flop of claim 6, wherein the master latch circuit comprises:
- a third blocking circuit configured to block application of the driving voltage to at least one circuit element of the master latch circuit in response to receiving the reset signal representing a reset operation of the master-slave flip-flop.

14. The master-slave flip-flop of claim 13, wherein the third blocking circuit comprises:
- a PMOS transistor including a gate configured to receive the reset signal, a source connected to a driving voltage node, and a drain connected to at least one transistor of the master latch circuit.

* * * * *